United States Patent
Ler et al.

(10) Patent No.: US 12,538,812 B2
(45) Date of Patent: Jan. 27, 2026

(54) SEMICONDUCTOR PACKAGES WITH WETTABLE FLANKS AND RELATED METHODS

(71) Applicant: SEMICONDUCTOR COMPONENTS INDUSTRIES, LLC, Phoenix, AZ (US)

(72) Inventors: Hui Min Ler, Seremban (MY); Swee Har Khor, Kuala Lumpur (MY); Ziming Chang, Tampin (MY); Kok Yang Lau, Asahan (MY); Heng Giap Ong, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 390 days.

(21) Appl. No.: 18/165,545

(22) Filed: Feb. 7, 2023

(65) Prior Publication Data
US 2024/0266264 A1    Aug. 8, 2024

(51) Int. Cl.
*H01L 21/56* (2006.01)
*H01L 23/00* (2006.01)
*H01L 23/495* (2006.01)

(52) U.S. Cl.
CPC ...... *H01L 23/49582* (2013.01); *H01L 21/561* (2013.01); *H01L 24/96* (2013.01); *H01L 2224/95001* (2013.01); *H01L 2224/96* (2013.01)

(58) Field of Classification Search
None
See application file for complete search history.

(56) References Cited

U.S. PATENT DOCUMENTS

| | | | |
|---|---|---|---|
| 2017/0133302 A1* | 5/2017 | Truhitte | H01L 23/49541 |
| 2018/0090421 A1 | 3/2018 | Then et al. | |
| 2019/0088579 A1 | 3/2019 | Truhitte et al. | |
| 2020/0357728 A1 | 11/2020 | Lam et al. | |
| 2023/0019610 A1* | 1/2023 | Jin | H01L 24/48 |

FOREIGN PATENT DOCUMENTS

| | | |
|---|---|---|
| DE | 102011109295 A1 | 2/2012 |
| WO | 2020185193 A1 | 9/2020 |

OTHER PUBLICATIONS

German Search Report, DE102024101159.9, German Patent Office, Sep. 13, 2024, 16 pages.

* cited by examiner

*Primary Examiner* — Jay C Chang
(74) *Attorney, Agent, or Firm* — IPTechLaw

(57) ABSTRACT

Implementations of a method of providing wettable flanks on leads of a semiconductor package may include applying mold compound around a plurality of leads included in a leadframe; electroplating exposed portions of the plurality of leads; cutting at least one lead of the plurality of leads to expose a flank of the least one lead; applying an electrically conductive layer over the plurality of leads; electroplating the flank of the at least one lead to render the flank wettable; removing the electrically conductive layer from the plurality of leads; and singulating to form a semiconductor package.

20 Claims, 9 Drawing Sheets

SEMICONDUCTOR PACKAGES WITH WETTABLE FLANKS AND RELATED METHODS

BACKGROUND

1. Technical Field

Aspects of this document relate generally to semiconductor packages, such as those used for semiconductor packages.

2. Background

Semiconductor packages work to provide mechanical support and electrical connections between a semiconductor device and a motherboard or other board to which the semiconductor package is attached. Semiconductor packages also work to protect the semiconductor device from humidity and electrostatic discharge energy.

SUMMARY

Implementations of a method of providing wettable flanks on leads of a semiconductor package may include applying mold compound around a plurality of leads included in a leadframe; electroplating exposed portions of the plurality of leads; cutting at least one lead of the plurality of leads to expose a flank of the least one lead; applying an electrically conductive layer over the plurality of leads; electroplating the flank of the at least one lead to render the flank wettable; removing the electrically conductive layer from the plurality of leads; and singulating to form a semiconductor package.

Implementations of a method of providing wettable flanks on leads of a semiconductor package may include one, all, or any of the following:

The electrically conductive layer may be an electrically conductive tape.

The electrically conductive tape may cover the entire leadframe.

The electrically conductive tape may cover a portion of the leadframe.

The electrically conductive layer may electrically couple the at least one lead with the leadframe.

Electroplating the flank of the at least one lead further may include rendering the flank wettable by reaching a plating thickness greater than 2 microns.

Implementations of a method of providing wettable flanks on leads of a plurality of semiconductor packages may include applying mold compound around a plurality of leads included in a semiconductor package, the semiconductor package one of a plurality of semiconductor packages included in a leadframe panel; electroplating exposed portions of the plurality of leads; cutting at least one lead of the plurality of leads to expose a flank of the least one lead; and applying an electrically conductive layer over the plurality of leads. The method may include electroplating the flank of the at least one lead to render the flank wettable; removing the electrically conductive layer; and singulating the leadframe panel to form a plurality of semiconductor packages.

The electrically conductive layer may be an electrically conductive tape.

The electrically conductive tape may cover the entire leadframe panel.

The electrically conductive tape may cover a portion of the leadframe panel.

The electrically conductive layer may electrically couple the at least one lead with the leadframe.

Electroplating the flank of the at least one lead further may include rendering the flank wettable by reaching a plating thickness greater than 2 microns.

Implementations of a method of providing wettable flanks on leads of a plurality of semiconductor packages may include applying mold compound around a plurality of leads included in a semiconductor package, the semiconductor package one of a plurality of semiconductor packages included in a leadframe panel; electroplating exposed portions of the plurality of leads; and cutting at least one lead of the plurality of leads to form a plurality of cut leads each including a flank. The method may also include coupling a jig over the plurality of leads, the jig providing an electrical connection to each of the plurality of cut leads; electroplating the plurality of cut leads to render the flank of each cut lead wettable; removing the jig from the plurality of leads; and singulating the leadframe panel to form a plurality of semiconductor packages.

The jig may contact each cut lead using a pogo pin.

The jig may be sized to contact each cut lead of the plurality of cut leads in the leadframe panel.

The jig may include electrically nonconductive material that forms a frame around each semiconductor package of the leadframe panel.

Electrically nonconductive material may include electrical routing that electrically couples each cut lead of the plurality of cut leads together.

Electroplating the plurality of cut leads to render the flank of each cut lead wettable further may include rendering the flank wettable by reaching a plating thickness greater than 2 microns.

The pogo pin may be spring loaded to apply a bias force to the cut lead.

The jig may include a plurality of windows therethrough, each window sized to correspond with a size of each semiconductor package of the leadframe panel and wherein one or more pogo pins may be supported within each window at one or more locations corresponding with one or more cut leads.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages with wettable flanks will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages with wettable flanks, and implementing components and methods, consistent with the intended operation and methods.

Figure 1:
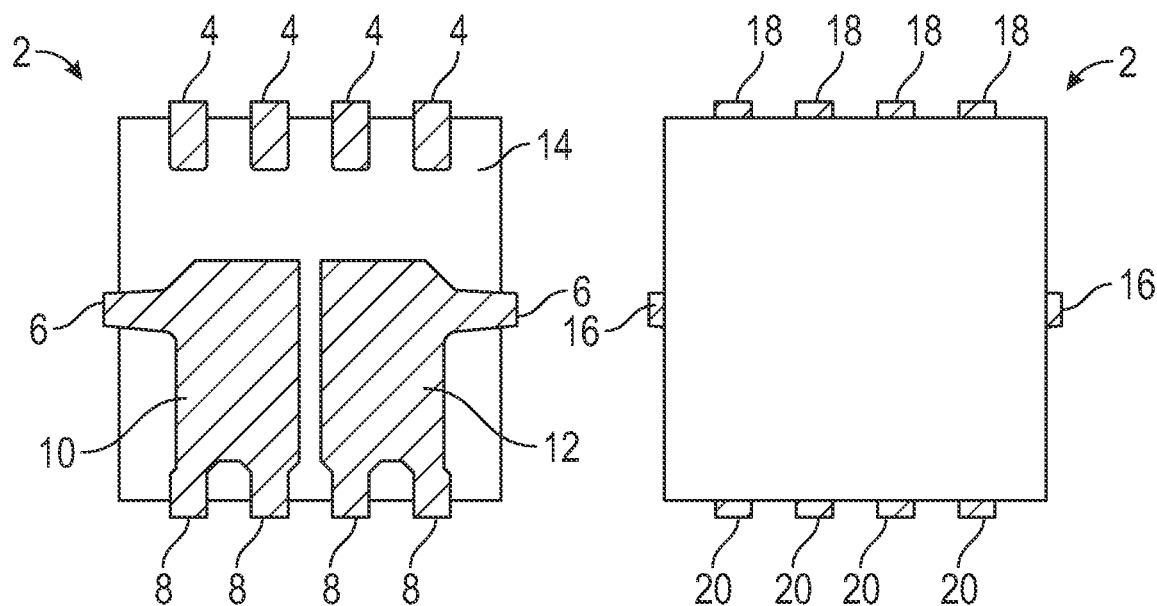
FIG. 1 is a bottom view of an implementation of a semiconductor package showing two die flags and a plurality of leads and a top view of the same package showing a mold compound.
Figure 2:
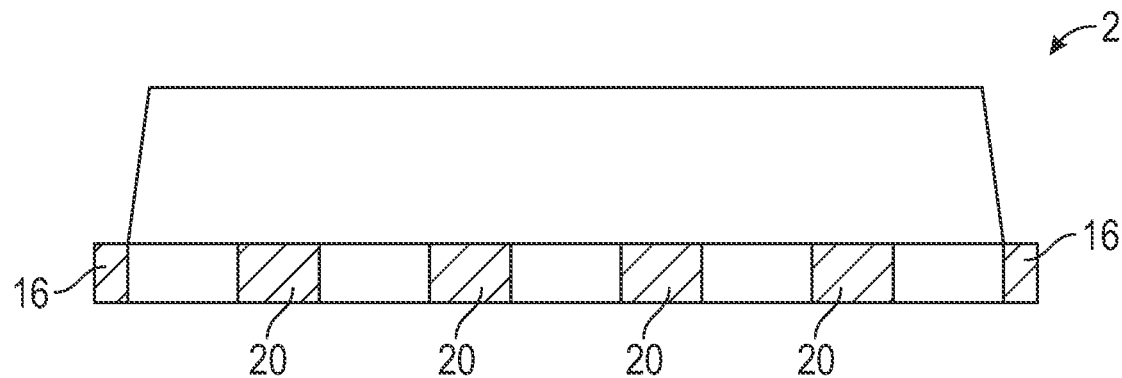
FIG. 2 is a side view of the semiconductor package implementation of FIG. 1.

Referring to FIG. 1, a bottom view of a semiconductor package 2 is illustrated. As illustrated, the package 2 includes a plurality of leads 4, 6, 8 and two die flags 10, 12 that extend from mold compound 14, which encapsulates one or more semiconductor die coupled to the plurality of leads. Any of a wide variety of semiconductor die could be used in various implementations, including, by non-limiting example, power semiconductor die, silicon carbide die, metal oxide semiconductor field effect transistors (MOSFETs), insulated-gate bipolar transistors (IGBITs), diodes, or any other semiconductor device type that can be coupled with leads or a leadframe structure. Furthermore, any of a wide variety of mold compounds may be employed in various package implementations, including, by non-limiting example, resins, polymers, epoxies, any combination thereof, or any other material capable of being molded or otherwise applied to protect the semiconductor die. Because the plurality of leads are close to or nearly flush with the edges of the mold compound 14, the package illustrated in FIG. 1 can be referred to as a "no-leads" package because it lacks extending pins or leads used to insert the package into a board or motherboard as it is designed to be surface mounted directly to the board/motherboard using soldering. As illustrated from the top view of the package and from the side view of the package 2 in FIG. 2, the flanks/sides 16, 18, 20 of the plurality of leads 4, 6, 8 extend slightly beyond the profile of the mold compound. These flanks 16, 18, 20 are often used to assist with securely bonding/mounting the package 2 to the board/motherboard. In various package implementations, for the flanks to assist in the bonding process, they need to be wettable with the particular solder material being used for the mounting process. In package implementations, the ability to cover the flanks 16, 18, 20 of the leads 4, 6, 8 with a material that is more solder wettable than the material of the leads itself can increase the bondability and reliability of the joints between the leads and the motherboard.

In various implementations a plateable material is used to coat the flanks of the leads 4, 6, 8 after the leads have been cut from a supporting leadframe. One of the challenges of applying a plateable material to the leads 4, 6, 8 is the physical inability to establish an electrical circuit with the leads following cutting of the leads, as they are no longer physically connected to the leadframe. In various package implementations, the use of electroless plating of materials like tin has been employed to coat the flanks to a thickness of between 1-2 microns since electroless plating does not rely on establishing a physical electrical connection with the leads. However, the thickness achievable with electroless plating may not be sufficient in particular implementations to achieve the desired sidewall solder wetting at the flanks.

The various package and method implementations disclosed herein are designed to permit electroplating of the flanks of the leads, which can produce thicknesses of wettable materials greater than 2 microns in various implementations. Also, the ability to employ electroplating can increase the number of plating material types that could be selected to form the layer of wettable material on the flanks of the leads over what is available using electroless plating. This is because electroless plating relies primarily on the comparative electrode potentials of the material(s) of the leads and those in the electroless plating bath to carry out the plating reaction, and there are a finite number of possible electrode potential pairs that actually have a sufficient difference to make the process work.

Figure 3:
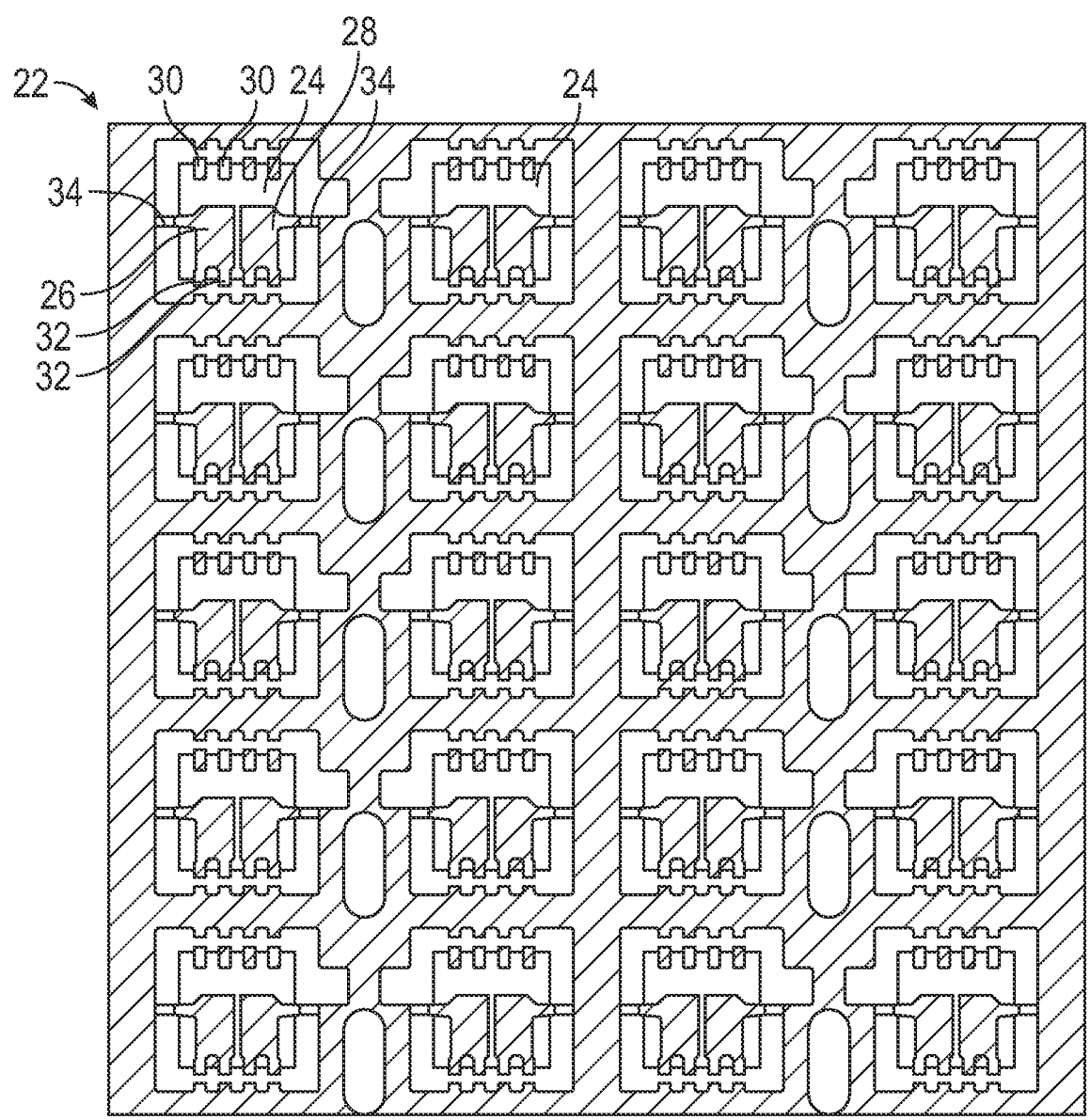
FIG. 3 is a top view of an implementation of a leadframe panel showing a plurality of semiconductor packages prior to singulation.

The various package implementations disclosed herein are formed using leadframes, portions of which become the leads and die flags (if die flags are present) of each package and which support the semiconductor die during the packaging process up through a final package singulation process. Leadframes that may be employed in the various semiconductor package implementations disclosed herein may take a wide variety of shapes and sizes including, by non-limiting example, single die leadframes, one unit leadframes (1U), two unit leadframes (2U), strips, panels, or any other leadframe configuration or design. Referring to FIG. 3, a bottom view of a leadframe 22 in panel form is illustrated that includes a plurality of semiconductor die coupled thereto all each encapsulated in mold compound 24 and showing die flags 26, 28 and leads 30, 32 following cutting of the leads 30, 32 to expose the flanks of the leads. While in the implementations disclosed herein the cutting of all leads in a particular direction is illustrated, in other implementations, only one, some, or all of the leads may be cut. Tie bars 34 remain connected following cutting of the leads 30, 32 to support the packages in place during the final processing steps prior to final singulation at which point the tie bars 34 are cut through. The leadframe 22 illustrated in FIG. 3 is shown prior to plating of the leadframe 22 with a solder wettable (or more solder wettable) material.

Figure 4:
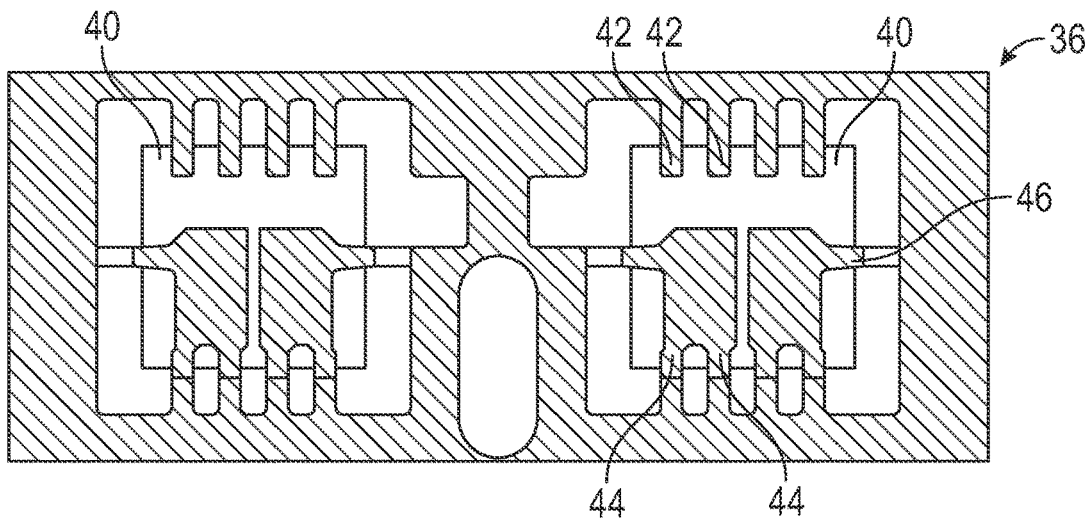
FIG. 4 is a bottom view of an implementation of a leadframe panel after molding and post mold cure (PMC)

Referring to FIG. 4, a bottom view of an implementation of a leadframe 36 is illustrated. In this implementation, the leadframe 36 is illustrated as a 2U leadframe, but the illustrated process can be applied to leadframes of all sizes from 1U to panel leadframes. The leadframe 36 of FIG. 4 is illustrated after the semiconductor die attach process, any interconnect processes (wire bonding, clips, etc.) have been carried out, and after mold compound 40 application is completed (including post-mold cure [PMC] in various implementations). The cross hatching of the leadframe 36 indicates that the material visible for the various leads 42, 44, 46 is the base material of the leadframe 36 at this stage of processing. The leadframe may be made of any of a wide variety of materials including, by non-limiting example, metals, metal alloys, copper, copper alloys, aluminum, aluminum alloys, or any other electrically conductive material capable of mechanically supporting the packages during processing.

Figure 5:
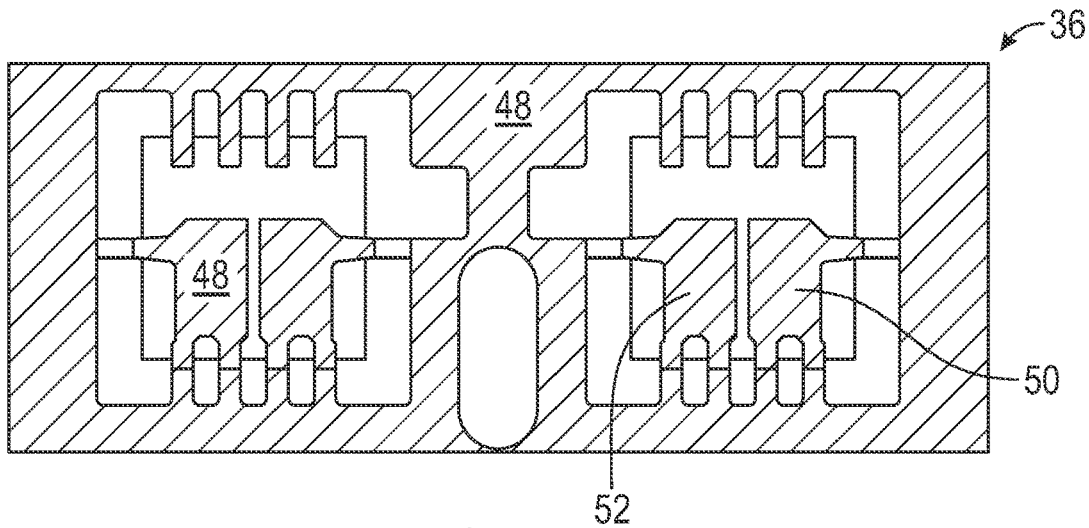
FIG. 5 is a bottom view of the leadframe panel implementation of FIG. 4 after electroplating of the plurality of leads and die flags.

Referring to FIG. 5, the bottom of the leadframe 36 is illustrated following plating of the exposed surfaces of the plurality of leads 42, 44, 46 and the die flags 50, 52 with a solder wettable material 48. Solder wettable materials that may be used in various package implementations disclosed herein may include, by non-limiting example, tin, nickel, gold, silver, copper, tin alloys, nickel alloys, gold alloys, silver alloys, copper alloys, any combination thereof, or any other desired electro- or electroless platable material that is wettable to a desired solder. As illustrated in FIG. 5, only the exposed portions of the leads 42, 44, 46 are coated with the solder wettable material 48.

Figure 6:
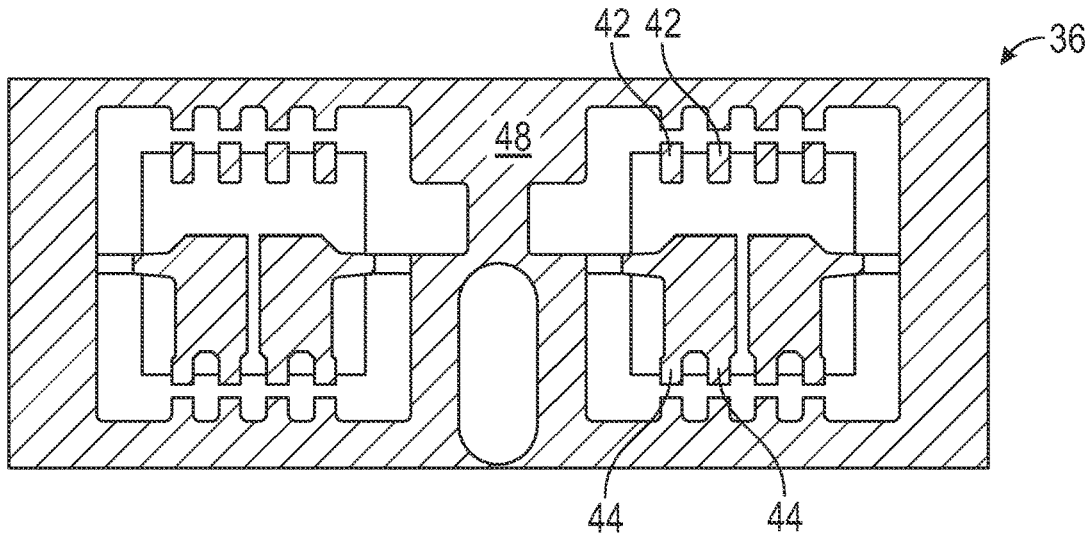
FIG. 6 is a bottom view of the leadframe panel implementation of FIG. 5 following cutting of a plurality of leads to form a plurality of cut leads.
Figure 7:
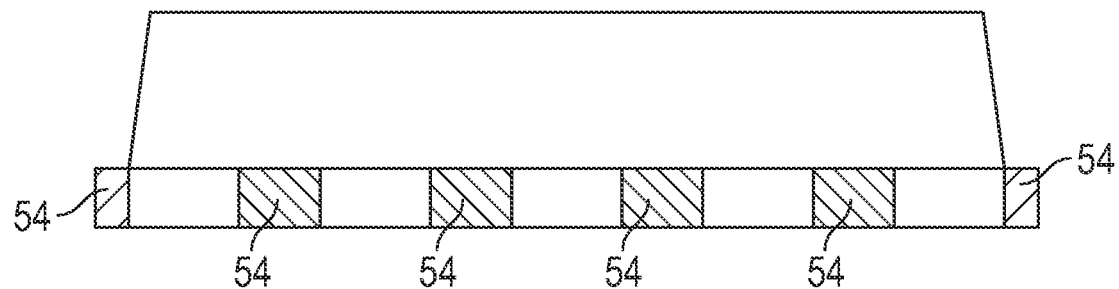
FIG. 7 is a side view of a semiconductor package showing the flanks of each of the plurality of cut leads immediately after lead cutting.

FIG. 6 illustrates the bottom of the leadframe 36 following cutting of the leads 42, 44 exposing the flanks of the leads for the first time. As illustrated, following cutting of the leads 42, 44, the original material of the leadframe 36 is exposed at the flank of each of the cut leads, and the solder wettable material 48 is not present on the flanks. FIG. 7 illustrates a side view of a semiconductor package at this point in the process which shows via the cross hatching applied to the flanks 54 that the exposed material at the flanks 54 is the original base material of the leadframe. Because the leads 42, 44 are now cut leads, they cannot be electroplated as they are electrically isolated from the leadframe 36.

Figure 8:
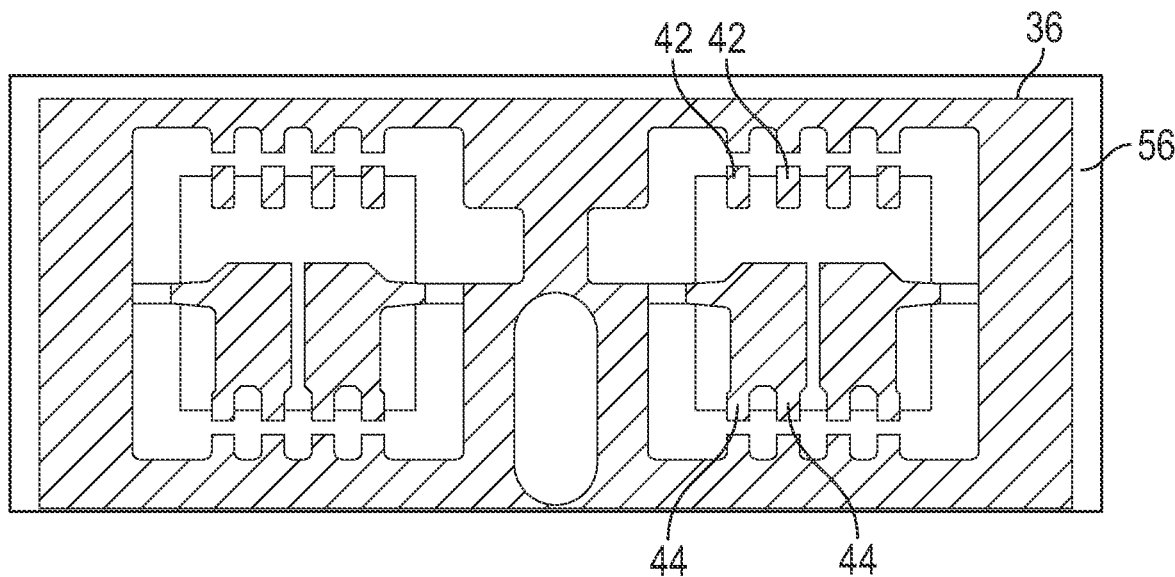
FIG. 8 is a bottom view of the semiconductor package implementation of FIG. 7 after application of an electrically conductive layer to the entire leadframe panel.
Figure 9:
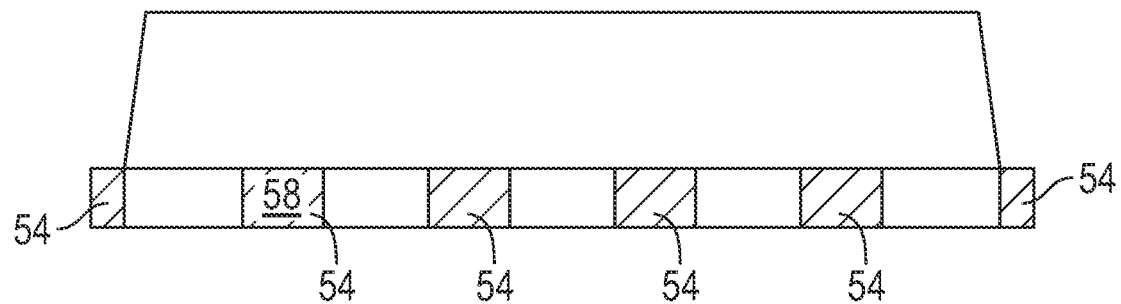
FIG. 9 is a side view of the semiconductor package of FIG. 7 after formation of wettable flanks through electroplating of the plurality of cut leads using the electrically conductive layer.

To form an electrical connection with the cut leads 42, 44, referring to FIG. 8 (partial see-through view), an electrically conductive layer 56 has been applied to the bottom surface of the leadframe 36 covering the previously applied solder wettable material 48. This electrically conductive layer 56 may be an electrically conductive tape in particular implementations or any other electrically conductive material that can be applied and then removed from the surface of the leadframe 36. Because the flanks 54 of the cut leads remain exposed from the top side of the leadframe after application of the electrically conductive layer 56 (see FIG. 7), the flanks 54 are now capable of being electroplated via the electrical connection to the leadframe 36 through the electrically conductive layer 56. FIG. 9 illustrates the flanks 54 following electroplating with a solder wettable material 58 shown using the different cross hatching than used in FIG. 7. In various implementations, the solder wettable material 58 may be the same as the one previously applied or a different one and may be applied to the same thickness or a different one. In various package implementations, the thickness of the solder wettable material 58 may be greater than two microns. Because the use of electroplating is permitted using the electrically conductive tape, the solder wettable material may be applied to a desired thickness. In various implementations, multiple layers of the same or different solder wettable materials may also be applied to the flanks 54 of the leads 42, 44. Following the electroplating process, the electrically conductive layer 56 is removed from the back side of the leadframe 36 before further processing. Further processing in various method implementations including final singulation of the various semiconductor packages from the leadframe using any singulation method (cutting, laser cutting, water jet cutting, etc.), testing of the semiconductor packaging, laser marking, or any other final processing steps.

Figure 10:
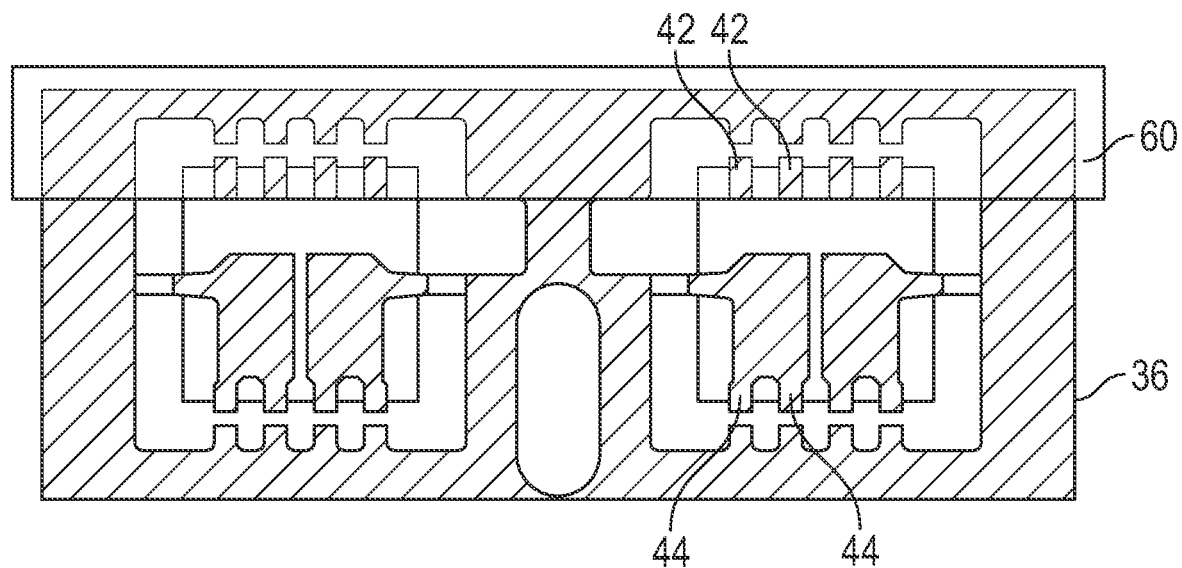
FIG. 10 is a bottom view of the semiconductor package implementation of FIG. 7 after application of an electrically conductive layer to a portion of the leadframe panel in contact with the plurality of cut leads.
Figure 14:
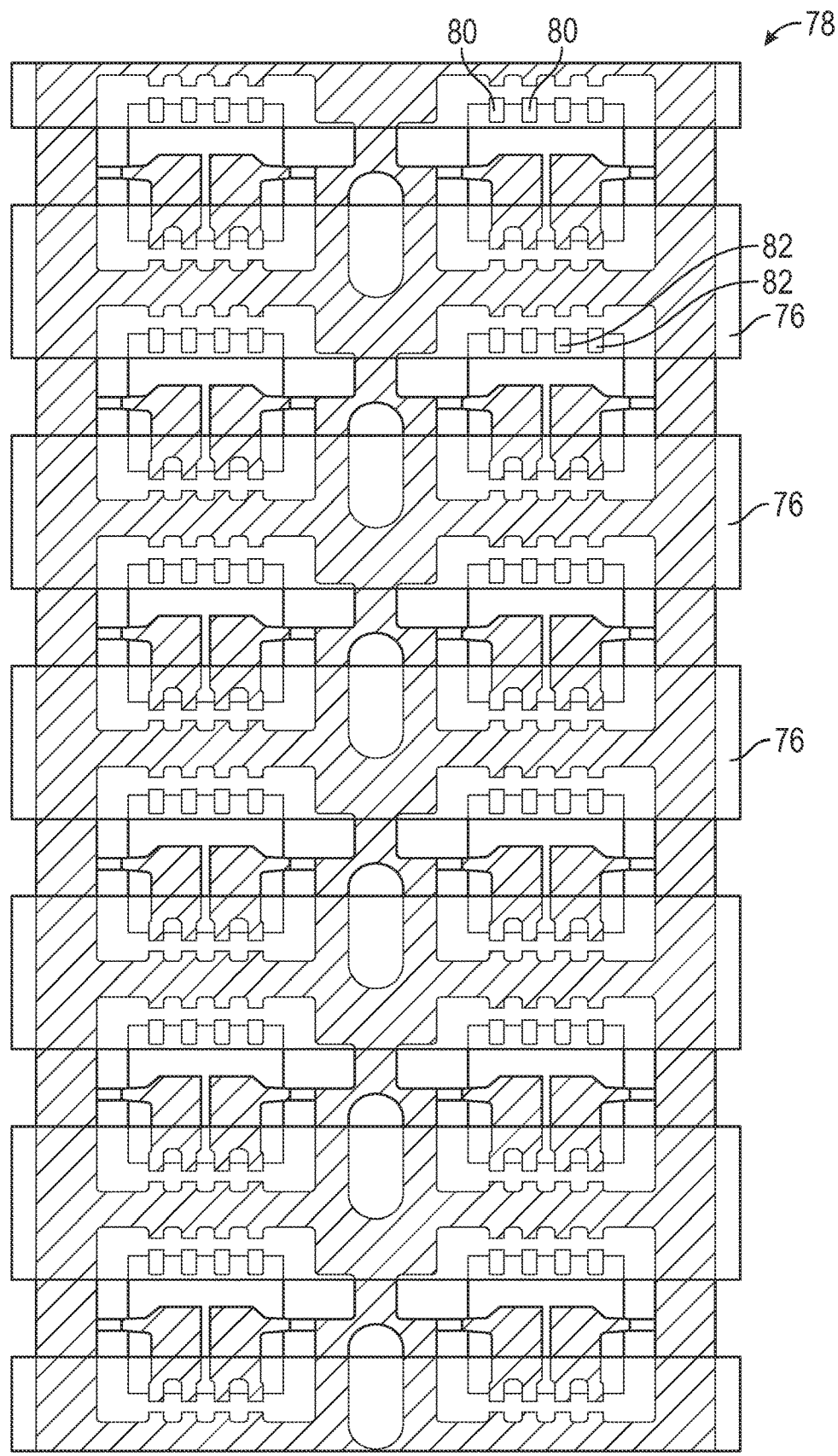
FIG. 14 is a bottom view of a leadframe panel with electrically conductive layers applied to portions of the panel over a plurality of cut leads.

While the use of an electrically conductive layer 56 across the entire back surface of the leadframe 36 has been illustrated thus far, in various method implementations, only a portion of the back surface of the leadframe 36 may be covered with the electrically conductive layer. As illustrated in the partial see-through view of FIG. 10, the leadframe 36 is illustrated following application of a strip 60 of electrically conductive layer material (like a tape or any other electrically conductive material disclosed herein) to the cut leads 42, 44 and the leadframe 36, thereby establishing an electrical connection between the cut leads 42, 44 and the leadframe. A single strip or multiple strips of the electrically conductive layer may be applied to the leadframe to ensure that all of the cut leads have been electrically connected and are ready for electroplating as previously described. FIG. 14 illustrates in partial see-through the use of multiple strips of electrically conductive layer material 76 that have been applied across the back surface of a leadframe panel 78 that form electrical connections with all of the cut leads 80, 82, even between leads on different packages. The semiconductor packages may then be singulated into a plurality of semiconductor packages from the leadframe 36 and any of the various other final processing steps previous described in this document carried out.

Figure 13:
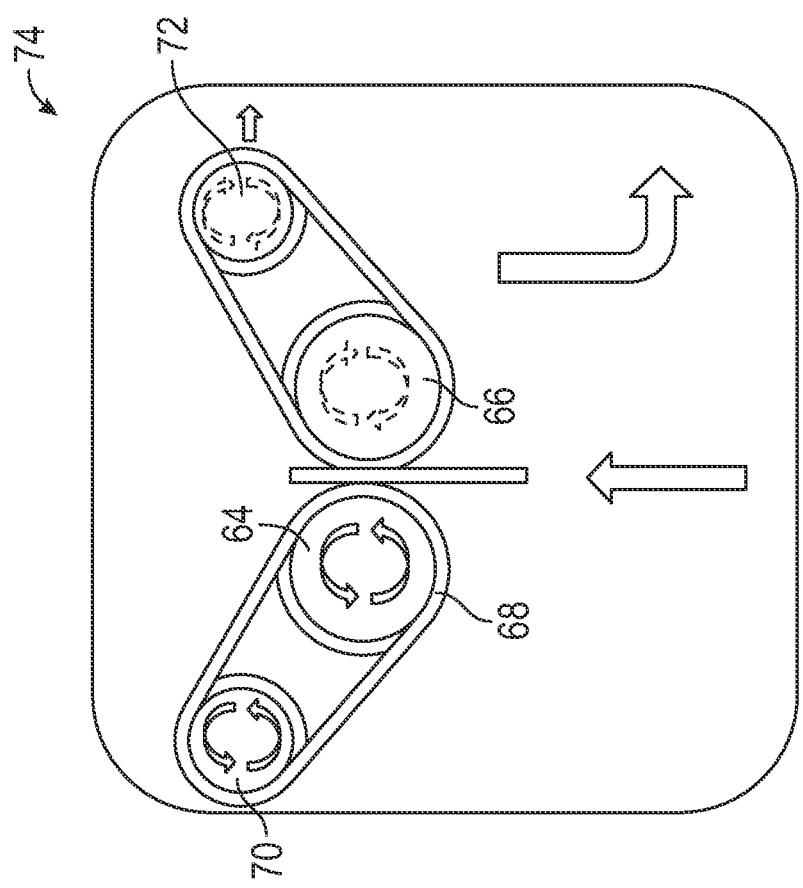
FIG. 13 is a diagram of the application process of an electrically conductive tape to a leadframe panel.

In both method implementations where the entire back surface of the leadframe and a portion of the back surface are covered by an electrically conductive layer or strip(s) of electrically conductive layer material, the electrically conductive layer may be reusable after the flank electroplating process has been completed following removal. Referring to FIG. 13, where the electrically conductive layer is formed of a tape, a tool 74 that enables consistent rolling on/rolling off of the tape is illustrated that enables reuse of the tape. As illustrated in FIG. 13, a leadframe panel 62 is passing through the dual rollers 64, 66. Roller 66 is used to apply pressure to the leadframe panel 62 while roller 64 is used to apply the electrically conductive tape 68 thereto. Following electroplating, a similar two roller process can be used to remove the electrically conductive tape 68 from the leadframe panel 62 and prepare the tape for re-application on a new leadframe panel. During operation of the tool 74, the rolling tension between the dual rollers and tension rollers 70, 72 can ensure good contact between the electrically conductive tape 68 and the cut leads of the leadframe panel 62. The dual rollers can also assist with the process of take up of the electrically conductive tape and transfer to a separate storage roller. In various tool implementation, a belt of material separate from the electrically conductive material may be employed to apply/retrieve the tape from the leadframe panel but in other implementations, the material between the tension and dual rollers may be just the electrically conductive material.

Figure 11:
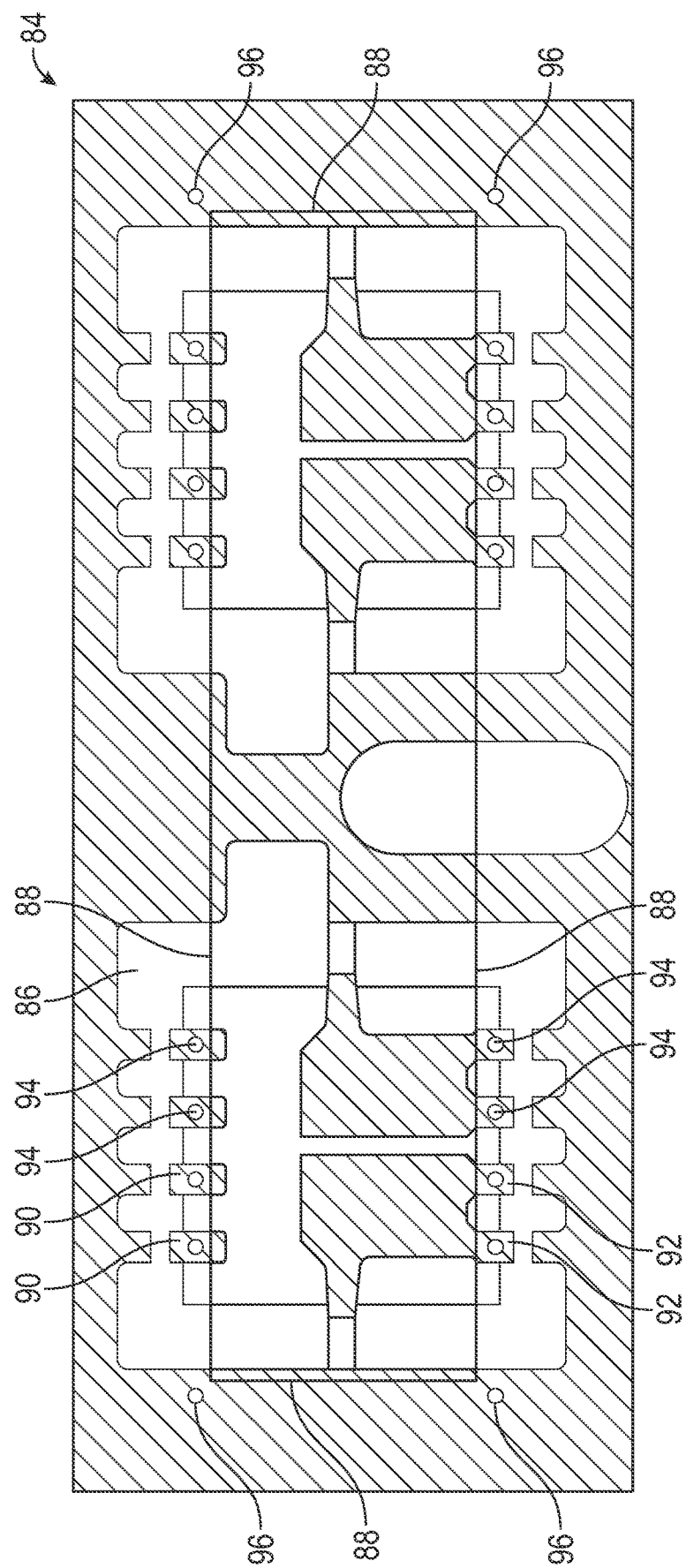
FIG. 11 is a detail bottom partial see-through view of a leadframe panel with an implementation of a jig coupled thereto.

In the previous method implementations disclosed herein, the use of electrically conductive material in layers has been disclosed as the mechanism for facilitating the electrical connection between the leadframe and the cut leads to enable electroplating of the lead flanks. In other method implementations, however, the use of jigs of various configurations may be used to make the electrical connection between the cut leads the leadframe. Referring to FIG. 11, a leadframe 84 similar in design to the leadframe 36 previously illustrated is shown in see-through view with rectangular jig 86 coupled thereto. As illustrated, the jig 86 includes a four-sided window 88 formed therein in that leaves much of the bottom surface of the leadframe 84 exposed, while covering the cut leads 90, 92 and placing them in contact with electrically conductive pogo pins 94 coupled with the jig 86. A set of corresponding pogo pins 96 are included that contact the leadframe 84. In implementation illustrated, the only contact between the jig 86 and the leadframe 84 is through the pogo pins 94, 96, allowing the jig 86 to be made of an electrically conductive material which permits formation of an electrical connection between to the cut leads 90, 92 and the leadframe 84. The jig 86 may be held to the leadframe 84 using various non-electrically conductive fasteners, such as, by non-limiting example, clips, spacers, jaws, clamps, or any other structure used for coupling two flat structures together. In various jig implementations, the pogo pins 94, 96 may be spring biased, to aid in applying a bias force against the bottom surface of the cut leads 90, 92, and leadframe 84. However, in other implementations, the pogo pins may not be biased or slidable, and may simply be fixed in position to provide the desired contact with the cut leads and leadframe.

Figure 12:
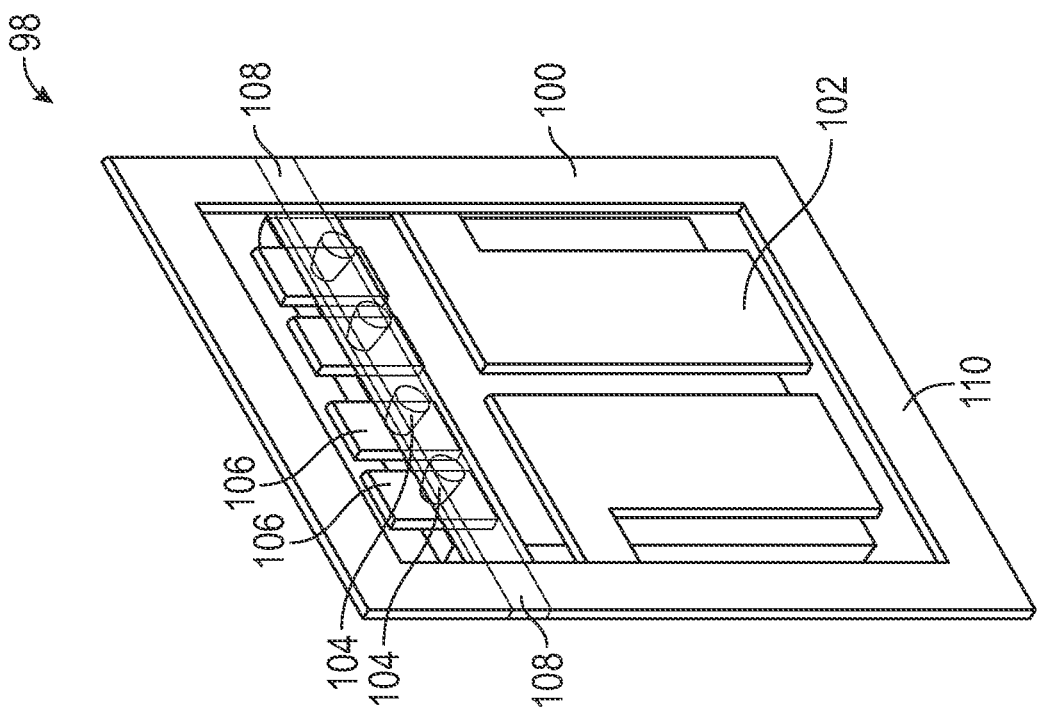
FIG. 12 is a detail perspective partial-see through view of a window of a jig coupled over the leads of a semiconductor package.

While the jig may be made of fully electrically conductive material in various implementations, in other implementations, only portions of the jig may be made of electrically conductive materials. Referring to FIG. 12, a partial see-through perspective view of a jig 100 coupled over a leadframe 102 with pogo pins 104 coupled with cut leads 106 is illustrated. In this view, for the sake of illustration, the mold compound is not shown. As illustrated, the rear surface of the pogo pins 104 are in contact with a strip of electrically conductive material 108 that is embedded or otherwise coupled into/with the non-electrically conductive material 110 of the jig 100. In this way, the rest of the jig 100 can be made of an non-electrically conductive material 110 while just the strips/portions 108 of the jig needed to provide electrical connection between the cut leads 106 and the leadframe 102 are made of the electrically conductive material. In various jig implementations, the non-electrically conductive materials that may be used may include, by non-limiting example, plastics, polymers, resins, ceramics, composites, any combination thereof, or any other non-electrically conductive materials with sufficient mechanical strength for use as a jig. The ability to use non-electrically conductive materials in the jig design may lower the overall material and/or production cost of the jig when compared with the use of electrically conductive materials.

Figure 15:
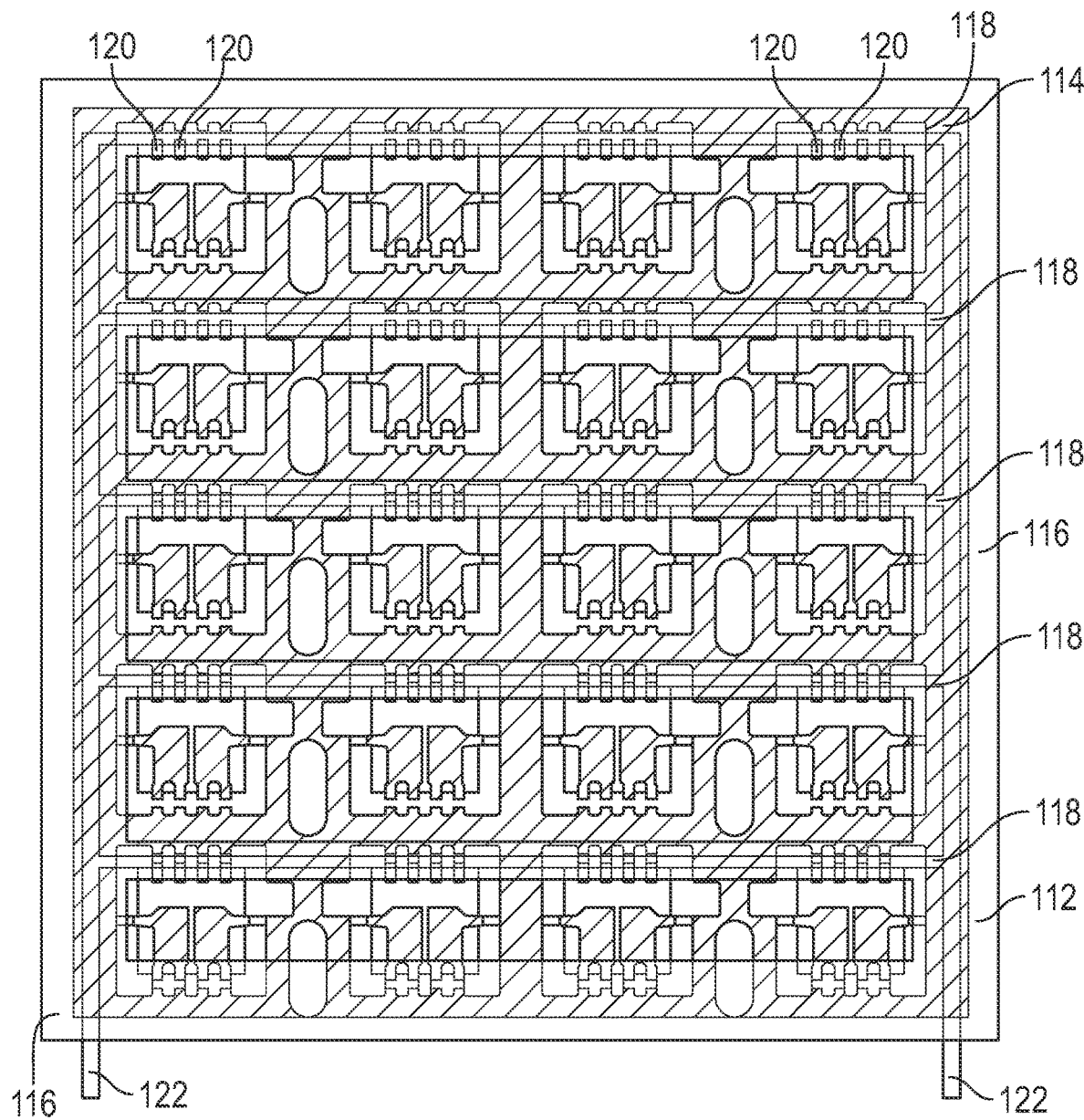
FIG. 15 is a bottom partial see-through view of a leadframe panel with a jig coupled thereto showing electrical routing in the jig.

While the use of jigs for 2U leadframes or 1U leadframes has been illustrated in FIGS. 11 and 12, jig designs can be devised that work for leadframes in panel form. Referring to FIG. 15, a partial see-through view of jig 112 coupled to leadframe 114 in panel form is illustrated. As illustrated in FIG. 15, the jig 112 is made of a non-electrically conductive material 116 and contains traces/lines 118 of electrically conductive material coupled therein/formed therein. The traces/lines 118 route across all of the cut leads 120 in the leadframe 114 and may be electrically coupled to the cut pins and leadframe via pogo pins like any illustrated in this document or fixed pins (the pins have been omitted from the view in FIG. 15 for purposes of simpler illustration). As illustrated, the traces/lines 118 establish an electrical connection between the cut leads 120 and the leadframe 114 and the jig 112 and route the electrical connections to connectors 122 which may be employed during the electroplating process to create the needed electrical circuit to support electroplating of the flanks of the cut leads 120. A wide variety of configurations of jigs are possible using the principles disclosed herein.

In places where the description above refers to particular implementations of semiconductor packages with wettable flanks and implementing components, sub-components, methods and sub-methods, it should be readily apparent that a number of modifications may be made without departing from the spirit thereof and that these implementations, implementing components, sub-components, methods and sub-methods may be applied to other semiconductor packages with wettable flanks.

What is claimed is:

1. A method of providing wettable flanks on leads of a semiconductor package, the method comprising:
    applying mold compound around a plurality of leads comprised in a leadframe;
    electroplating exposed portions of the plurality of leads;
    cutting at least one lead of the plurality of leads to expose a flank of the least one lead;
    applying an electrically conductive layer over the plurality of leads;
    electroplating the flank of the at least one lead to render the flank wettable;
    removing the electrically conductive layer from the plurality of leads; and
    singulating the leadframe, after removing the electrically conductive layer, to form a semiconductor package.

2. The method of claim 1, wherein the electrically conductive layer is an electrically conductive tape.

3. The method of claim 2, wherein the electrically conductive tape covers the entire leadframe.

4. The method of claim 2, wherein the electrically conductive tape covers only a portion of a single side of the semiconductor package.

5. The method of claim 1, wherein an electroplated die flag of the leadframe is exposed when the electrically conductive layer is coupled over the at least one lead.

6. The method of claim 1, wherein electroplating the flank of the at least one lead further comprises rendering the flank wettable by reaching a plating thickness greater than 2 microns.

7. A method of providing wettable flanks on leads of a plurality of semiconductor packages, the method comprising:
    applying mold compound around a plurality of leads comprised in a semiconductor package, the semiconductor package one of a plurality of semiconductor packages comprised in a leadframe panel;
    electroplating exposed portions of the plurality of leads;
    cutting at least one lead of the plurality of leads to expose a flank of the least one lead;
    applying an electrically conductive layer over the plurality of leads;
    electroplating the flank of the at least one lead to render the flank wettable;

removing the electrically conductive layer; and singulating the leadframe panel after removing the electrically conductive layer to form the plurality of semiconductor packages.

8. The method of claim 7, wherein the electrically conductive layer is an electrically conductive tape.

9. The method of claim 8, wherein the electrically conductive tape covers the entire leadframe panel.

10. The method of claim 8, wherein the electrically conductive tape covers only a portion of a single side of each semiconductor package.

11. The method of claim 7, wherein the electrically conductive layer electrically couples the at least one lead with the leadframe panel.

12. The method of claim 7, wherein electroplating the flank of the at least one lead further comprises rendering the flank wettable by reaching a plating thickness greater than 2 microns.

13. The method of claim 7, wherein an electroplated die flag of the leadframe panel is exposed when the electrically conductive layer is coupled over the at least one lead.

14. A method of providing wettable flanks on leads of a plurality of semiconductor packages, the method comprising:

applying mold compound around a plurality of leads comprised in a semiconductor package, the semiconductor package one of a plurality of semiconductor packages comprised in a leadframe panel;

electroplating exposed portions of the plurality of leads;

cutting at least one lead of the plurality of leads to form a plurality of cut leads each comprising a flank;

coupling a jig over the plurality of leads, the jig providing an electrical connection to each of the plurality of cut leads using a pogo pin;

electroplating the plurality of cut leads to render the flank of each cut lead wettable;

removing the jig from the plurality of leads; and singulating the leadframe panel to form the plurality of semiconductor packages.

15. The method of claim 14, wherein the jig is sized to contact each cut lead of the plurality of cut leads in the leadframe panel.

16. The method of claim 14, wherein the jig comprises electrically nonconductive material that forms a frame around each semiconductor package of the leadframe panel.

17. The method of claim 16, wherein electrically nonconductive material comprises electrical routing that electrically couples each cut lead of the plurality of cut leads together.

18. The method of claim 14, wherein electroplating the plurality of cut leads to render the flank of each cut lead wettable further comprises rendering the flank wettable by reaching a plating thickness greater than 2 microns.

19. The method of claim 4, wherein the pogo pin is spring loaded to apply a bias force to the cut lead.

20. The method of claim 14, wherein the jig comprises a plurality of windows therethrough, each window sized to correspond with a size of each semiconductor package of the leadframe panel and wherein one or more pogo pins are supported within each window at one or more locations corresponding with one or more cut leads.

* * * * *